United States Patent
Youssef et al.

(10) Patent No.: US 8,049,568 B2
(45) Date of Patent: Nov. 1, 2011

(54) FEEDBACK-BASED LINEARIZATION OF VOLTAGE CONTROLLED OSCILLATOR

(75) Inventors: Michael Youssef, Newport Coast, CA (US); Ahmad Mirzaei, Costa Mesa, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 83 days.

(21) Appl. No.: 12/557,149

(22) Filed: Sep. 10, 2009

(65) Prior Publication Data

US 2011/0057731 A1 Mar. 10, 2011

(51) Int. Cl.
*H03L 7/085* (2006.01)
*H03L 7/06* (2006.01)
(52) U.S. Cl. ............ 331/17; 331/1 R; 327/156; 327/176
(58) Field of Classification Search .................. 331/1 R, 331/10, 11, 17, 25, 34, 44, 176; 327/156, 327/155
See application file for complete search history.

(56) References Cited

U.S. PATENT DOCUMENTS 6,262,609 B1 * 7/2001 Hafez et al. ................ 327/156
6,614,313 B2 * 9/2003 Crofts et al. ................ 331/1 R

OTHER PUBLICATIONS

Zhao, et al., "A 0.18um RF CMOS Ultra Wide Band Transmitter Front End RFIC", Radio Frequency Integrated Circuits (RFIC) Symposium, 2006 IEEE, Jun. 11-13, 2006, 4 pp.—509.*
Abidi, "Linearization of Voltage-Controlled Oscillators Using Switched-Capacitor Feedback", Solid-State Circuits, IEEE Journal of, vol. 22, Issue: 3, 1987, pp. 494-496.*
VIswanatha et al., "Switched-Capacitor Frequency Control Loop", Solid-State Circuits, IEEE Journal of, vol. 17, Issue: 4, 1982, pp. 775-778.*

* cited by examiner

*Primary Examiner* — Ryan Johnson
(74) *Attorney, Agent, or Firm* — Sterne, Kessler, Goldstein & Fox P.L.L.C.

(57) ABSTRACT

Embodiments of the present invention enable a feedback-based VCO linearization technique. Embodiments include a frequency locked loop formed by feeding back a VCO's output into the VCO's input in negative phase by means of a frequency-to-voltage (F/V) converter. Embodiments enable constant VCO gain over a wide input tuning range and across PVT variations. Further, embodiments can be nested within a PLL, for example, with negligible area and power consumption overhead.

21 Claims, 13 Drawing Sheets

FEEDBACK-BASED LINEARIZATION OF VOLTAGE CONTROLLED OSCILLATOR

BACKGROUND

1. Field of the Invention

The present invention relates generally to linearization of voltage controller oscillators (VCOs).

2. Background Art

Conventionally, VCOs use MOSFET variable capacitors (varactors) and thus are inherently non-linear.

Various calibration methods exist for linearizing VCOs. For example, one technique attempts to operate the VCO in a linear region of its gain response function. However, this technique only works for small signal modulation and does not work when modulating wide bandwidth signals, such as WCDMA and EDGE signals, for example. Another technique uses a set of varactors biased in a staggered fashion so as to generate in the aggregate a linear transient response of the VCO. However, this technique does not address VCO gain variations due to process, voltage, and temperature (PVT) variations. In addition, because each varactor requires a clean reference voltage for operation, implementation of this technique is both difficult and expensive.

Thus, conventional VCO gain linearization techniques are not suitable for generating complex wide bandwidth waveforms, cannot handle PVT variations, and are relatively difficult and expensive to implement.

Accordingly, there is a need for improved methods and systems for linearizing the gain of a VCO.

BRIEF SUMMARY

Embodiments of the present invention relate generally to linearization of voltage controller oscillators.

Embodiments of the present invention, as will be further described below, enable a feedback-based VCO linearization technique. Embodiments include a frequency locked loop formed by feeding back a VCO's output into the VCO's input in negative phase by means of a frequency-to-voltage (F/V) converter. Embodiments enable constant VCO gain over a wide input tuning range and across PVT variations. Further, embodiments can be nested within a PLL, for example, with negligible area and power consumption overhead.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Linear gain voltage controlled oscillators (VCOs) are desirable in many applications, including phase locked loop (PLL)-based phase modulators and frequency synthesizers, for example. In phase modulators, it is desired that the VCO gain is as linear as possible to not disturb the output of the phase modulator. For example, a non-linear gain VCO may cause unwanted frequency components to appear at the output of the phase modulator, possibly violating the transmission mask and/or the adjacent channel leakage ratio (ACLR) specifications. In frequency synthesizers, because the transient response and the loop bandwidth of the frequency synthesizer are strongly dependent on the gain of the VCO ($K_{VCO}$), non-linearities in the VCO gain cause the loop bandwidth of the frequency synthesizer to vary with frequency, resulting in stability problems.

Thus, generally, constant VCO gain is desired over a wide range of input tuning voltage. In addition, constant VCO gain over process, voltage, and temperature (PVT) variations is desired as it simplifies significantly the design of PLL-based phase modulators and frequency synthesizers. For example, constant VCO gain over PVT variations eliminates the need for VCO calibration, simplifying the complexity of any on-chip DSP engines and reducing the time required for startup adjustments.

Conventionally, VCOs use MOSFET variable capacitors (varactors) and thus are inherently non-linear. Various calibration methods exist for linearizing VCOs. For example, one technique attempts to operate the VCO in a linear region of its gain response function. However, this technique only works for small signal modulation and does not work when modulating wide bandwidth signals, such as WCDMA and EDGE, for example. Another technique uses a set of varactors biased in a staggered fashion so as to generate in the aggregate a linear transient response of the VCO. However, this technique does not address VCO gain variations due to PVT variations.

In addition, because each varactor requires a clean reference voltage for operation, implementation of this technique is both difficult and expensive.

Thus, conventional VCO gain linearization techniques are not suitable for generating complex wide bandwidth waveforms, cannot handle PVT variations, and are relatively difficult and expensive to implement.

Accordingly, there is a need for improved methods and systems for linearizing the gain of a VCO.

Embodiments of the present invention, as will be further described below, enable a feedback-based VCO linearization technique. Embodiments include a frequency locked loop formed by feeding back a VCO's output into the VCO's input in negative phase by means of a frequency-to-voltage (F/V) converter. Embodiments enable constant VCO gain over a wide input tuning range and across PVT variations. Further, embodiments can be nested within a PLL, for example, with negligible area and power consumption overhead.

Figure 1:
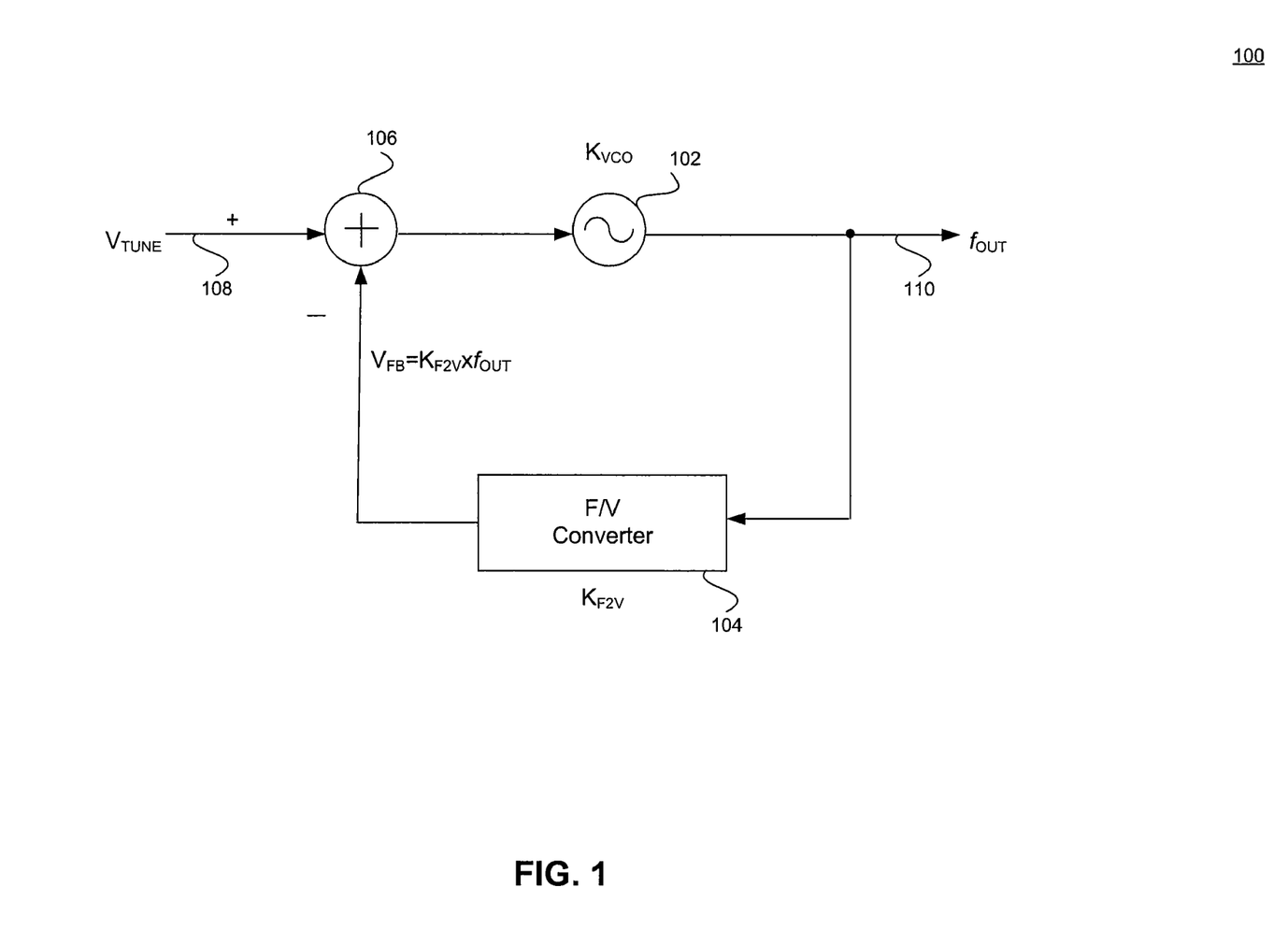
FIG. 1 illustrates an example frequency locked loop (FLL) for linearizing a voltage controlled oscillator (VCO) according to an embodiment of the present invention.

FIG. 1 illustrates an example frequency locked loop (FLL) 100 for linearizing a voltage controlled oscillator (VCO) 102 according to an embodiment of the present invention.

As shown in FIG. 1, FLL 100 includes a VCO 102, a F/V converter 104, and a subtractor 106. An input tuning voltage $V_{TUNE}$ 108 is coupled to the positive terminal of subtractor 106, and an output frequency signal $f_{OUT}$ 110 is generated at the output of VCO 102. A feedback loop including F/V converter 104 couples output frequency signal $f_{OUT}$ 110 to the negative terminal of subtractor 106.

Assuming that the gains of VCO 102 and F/V converter 104 are $K_{VCO}$ and $K_{F2V}$ respectively, the gain $F_{VCO-FB}$ of FLL 100 can be written as:

$$K_{VCO-FB} = \frac{K_{VCO}}{1 + K_{VCO} \cdot K_{F2V}}. \quad (1)$$

With $K_{VCO} \cdot K_{F2V} \gg 1$, equation (1) can be approximated as:

$$K_{VCO-FB} = \frac{1}{K_{F2V}}. \quad (2)$$

Thus, effectively, the gain of FLL 100 is independent of the gain $K_{VCO}$ of VCO 102 and only depends on the gain $K_{F2V}$ of F/V converter 104. As a result, FLL 100 can be made linear and PVT independent by designing F/V converter 104 to have constant and PVT independent gain.

Figure 2:
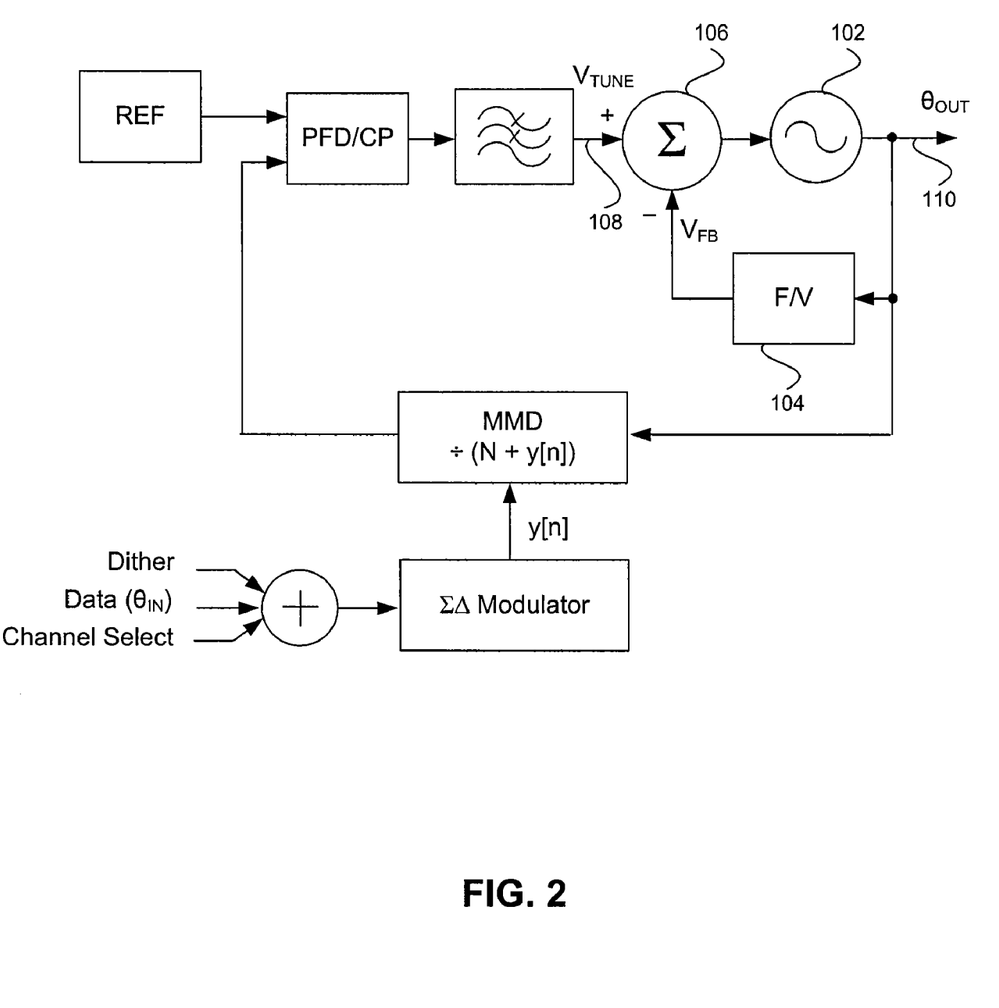
FIG. 2 illustrates a phase locked loop (PLL) having a nested FLL according to an embodiment of the present invention.

According to embodiments, FLL 100 can be nested within a PLL, in a PLL-based phase modulator or frequency synthesizer, for example. FIG. 2 illustrates an example embodiment having FLL 100 nested in a PLL. It is noted that in such embodiment it is necessary that FLL 100 has a high enough bandwidth (i.e., speed) compared to the PLL, in order not to disturb the PLL output. However, when this bandwidth requirement is satisfied, the PLL response function continues to have the same characteristics as with an open-loop VCO, but with $K_{VCO}$ replaced with $1/K_{F2V}$ in the response function.

As noted above, FLL 100 can be made linear and PVT independent by designing F/V converter 104 to have constant and PVT independent gain. In practice, a F/V converter is equivalent to a FM (frequency modulation) detector or demodulator. Conventional FM detectors (e.g., slope detector, Foster-Seely discriminator, ratio detector, gated-beam detector, etc.) are all based on the dependence of an inductor's reactance on frequency. As such, besides being bulky and unsuitable for integration into a PLL, conventional F/V converters exhibit a linear gain dependence on frequency. Thus, conventional F/V converters cannot have constant gain across a wide input frequency range.

Embodiments of the present invention, as further described below, employ a switched capacitor circuit to produce a linear and PVT independent F/V converter. Since switched capacitor circuits are inexpensive and small in size, embodiments can be easily integrated into a PLL, for example.

Figure 3:
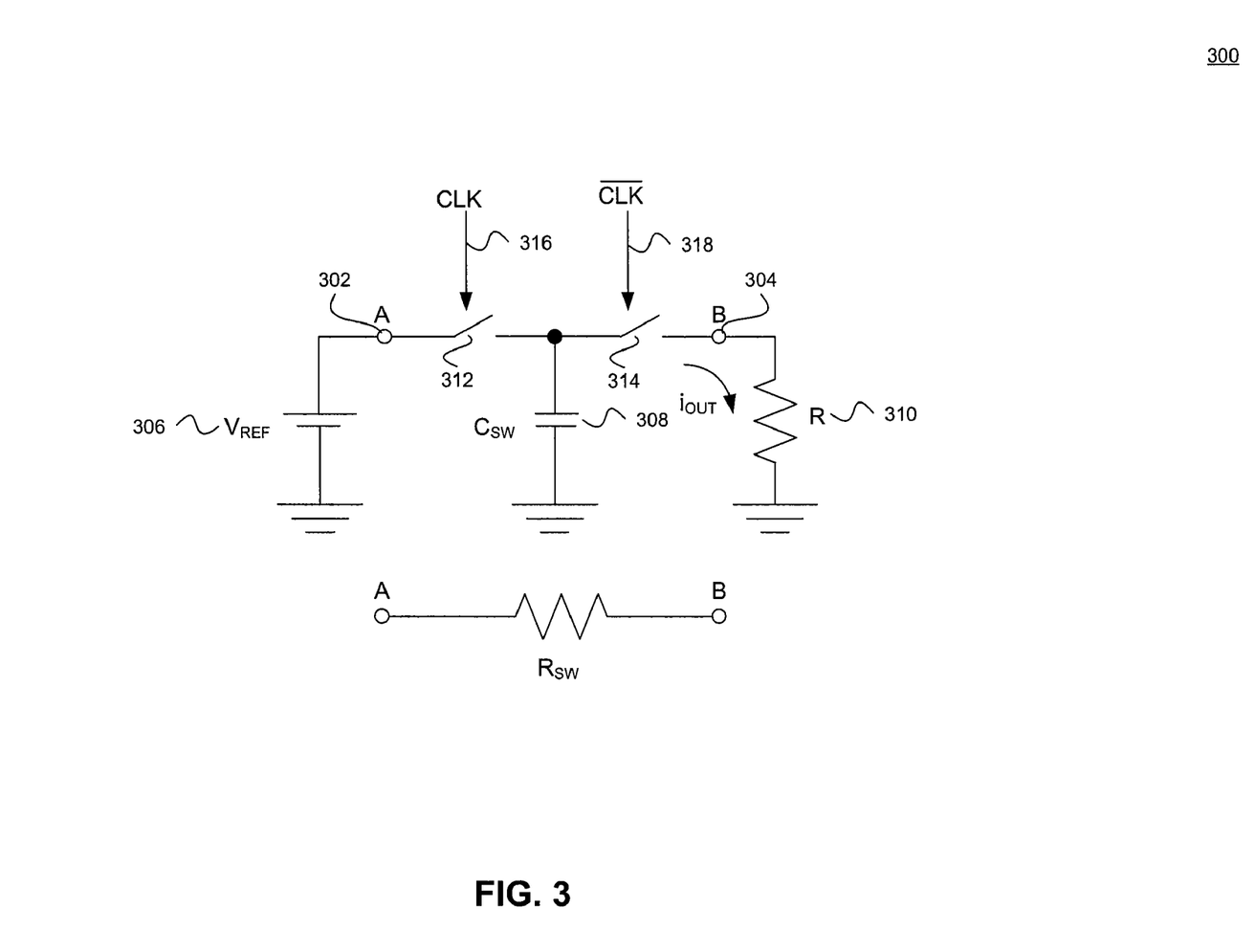
FIG. 3 illustrates an example switched capacitor circuit.

FIG. 3 illustrates an example switched capacitor circuit 300 according to an embodiment of the present invention. As shown in FIG. 3, switched capacitor circuit 300 includes a capacitor 308 and two switches 312 and 314. Switches 312 and 314 are controlled respectively by control signals CLK 316 and $\overline{CLK}$ 318, which are non-overlapping clock signals of frequency $f_{CLK}$. A reference voltage $V_{REF}$ 306 is coupled at input node A 302 of switched capacitor circuit 300. The output voltage, $V_{OUT}$, of switched capacitor circuit 300 is measured across a resistor 310, coupled between output node B 304 and ground.

Because CLK 316 and $\overline{CLK}$ 318 are non-overlapping clock signals, capacitor 308 is alternately coupled to input node A 302 and output node B 304 at a switching frequency equal to $f_{CLK}$. Thus, at every switching cycle, capacitor 308 transfers a charge from $V_{REF}$ 306 to resistor 310 at the switching frequency $f_{CLK}$.

It can be shown that an effective resistance, $R_{SW}$, between input node 302 and output node 304 is equal to $1/(C_{SW} \cdot f_{CLK})$, where $C_{SW}$ is the capacitance of capacitor 308. Therefore, when the resistance R of resistor 310 is significantly lower than $R_{SW}$, the output voltage $V_{OUT}$ can be written as:

$$\begin{aligned}
V_{OUT} &= i_{OUT} \cdot R \quad (3)\\
&\approx \frac{V_{ref}}{R_{SW}} \cdot R\\
&= V_{ref} \cdot C_{SW} \cdot f_{CLK} \cdot R\\
&= (V_{ref} \cdot R \cdot C_{SW}) \cdot f_{CLK}\\
&= k_{F2V} \cdot f_{CLK}
\end{aligned}$$

Accordingly, the output voltage, $V_{OUT}$, of switched capacitor circuit 300 is a function of switching frequency $f_{CLK}$. Furthermore, it is noted that the gain $k_{F2V}$ of switched capacitor circuit 300 is independent of frequency and is a function of $V_{REF}$ (a constant) and the time constant $R \cdot C_{SW}$. Thus, if the time constant $R \cdot C_{SW}$ can be calibrated for PVT variations (which can be achieved using simple on-chip RC calibration circuitry), switched capacitor circuit 300 provides a linear, PVT independent frequency to voltage converter.

Figure 4:
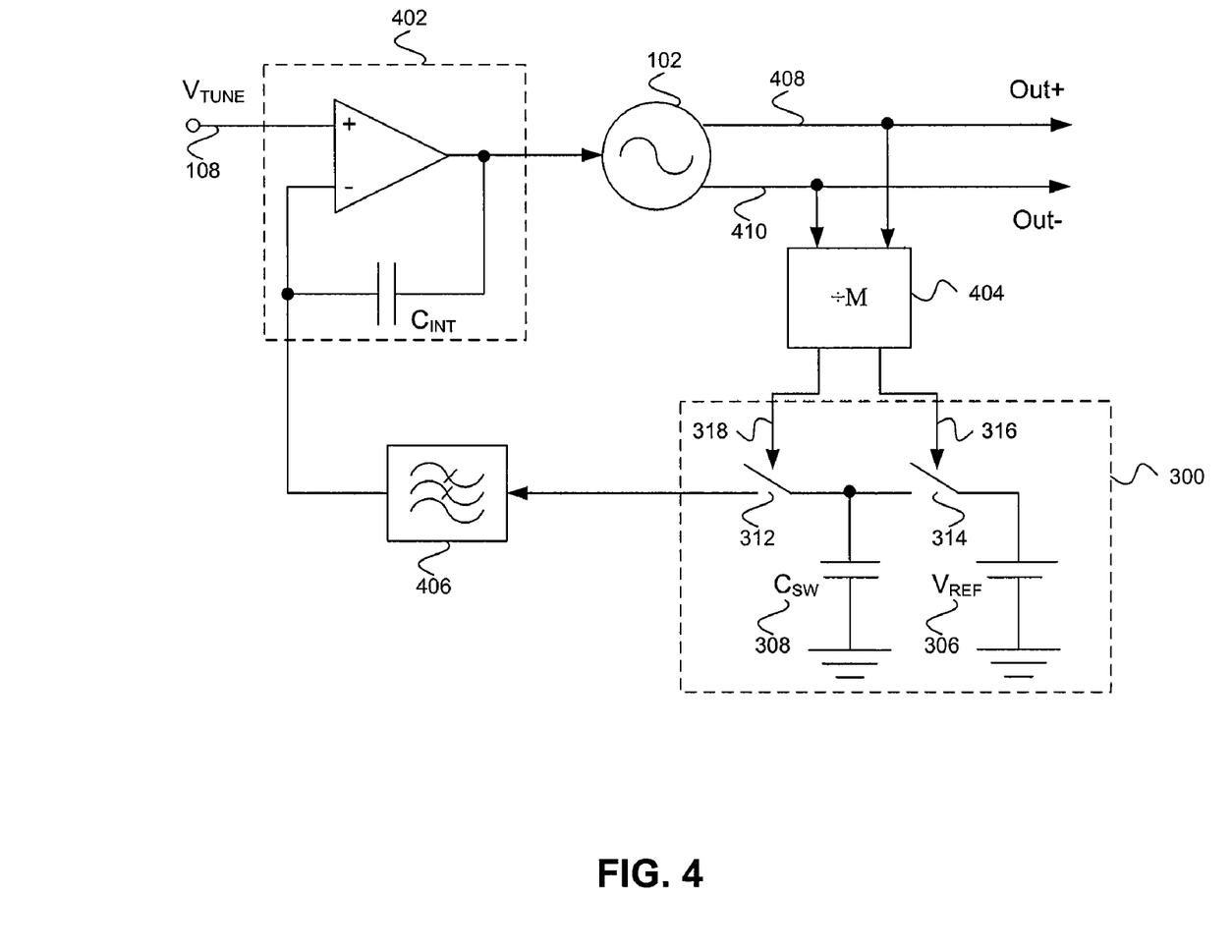
FIG. 4 illustrates an example FLL according to an embodiment of the present invention.

FIG. 4 illustrates an example FLL 400 according to an embodiment of the present invention. As shown in FIG. 4, FLL 400 includes in its feed-forward section an operational amplifier-based integrator 402 followed by VCO 102. In its feedback loop, FLL 400 includes a frequency divider 404, F/V converter 300, and a filter 406.

Integrator 402 is an embodiment of subtractor 106, described above in FIG. 1. Thus, integrator 402 subtracts the voltage output of filter 406 from input tuning voltage $V_{TUNE}$ 108. The resulting error voltage signal is input into VCO 102.

In an embodiment, as shown in FIG. 2, VCO 102 is a differential output oscillator. Thus, VCO 102 generates frequency signals Out+ 408 and Out− 410, which are fed back through frequency divider 404 to F/V converter 300. In an embodiment, frequency divider 404 divides-down frequency signals Out+ 408 and Out− 410 by a pre-determined integer n, and further includes clock generating circuitry for generating non-overlapping clock signals 316 and 318, described above with reference to FIG. 3. In another embodiment, a separate clock generating circuitry, coupled between frequency divider 404 and F/V converter 300, is used to generate clock signals 316 and 318.

F/V converter 300, as described above with reference to FIG. 3, receives non-overlapping clock signals 316 and 318 and generates an output voltage representative of the frequency of clock signals 316 and 318.

Filter 406 filters out the output voltage of F/V converter 300. In an embodiment, filter 406 is a current-mode second-order low-pass filter. It is noted that the low-pass nature of the feedback loop of FLL 100 helps clean the phase noise of VCO 102 at close-in offset frequencies. This is in addition to the fact that the feedback loop of FLL 100 helps reduce the phase noise of VCO 102 within the bandwidth of FLL 100.

It is noted that from equation (2) above that the output frequency of FLL 100 can be written as:

$$f_{OUT} = \left(\frac{1}{K_{F2V}}\right) \cdot V_{TUNE} = \left(\frac{1}{V_{ref} \cdot R \cdot C_{SW}}\right) \cdot V_{TUNE} \quad (4)$$

Thus, the output frequency of FLL 100 is a linear function of the input tuning voltage, insensitive to non-linearities inherent in VCO 102, PVT variations, and frequency of operation. Moreover, with a simple on-chip RC calibration circuit and a constant reference voltage, the value of the gain (or the sensitivity) of FLL 100 can be set very accurately.

Figure 5:
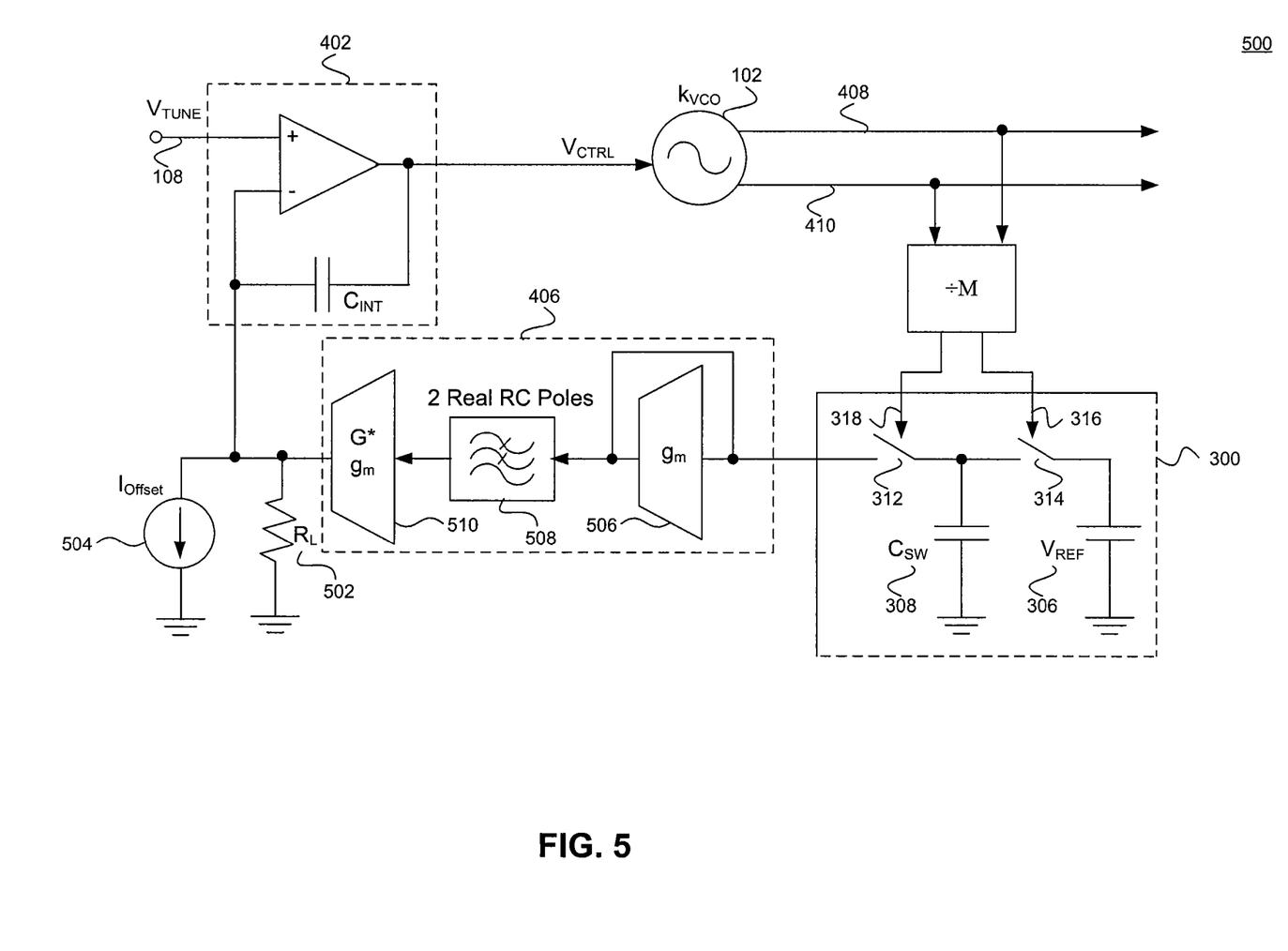
FIG. 5 illustrates another example FLL according to an embodiment of the present invention.

FIG. 5 illustrates another example FLL 500 according to an embodiment of the present invention. Example FLL 500 is similar to example FLL 400 described above with reference to FIG. 4. In addition, as shown in FIG. 5, FLL 500 includes an offset current source 504, coupled at the output of filter 406. Offset current source 504 compensates for the inherent offset in VCO 102. In an embodiment, offset current source 504 absorbs the output current of filter 406 when VCO 102 is free running (for $V_{TUNE}$ equal to zero).

FLL 500 also includes a load resistor $R_L$ 502 coupled at the output of filter 406. Resistor 502 corresponds to resistor 310, described above in FIG. 3. Thus, resistor 502 and capacitor 308 provide the time constant of switched capacitor circuit 300. In an embodiment, as further described below, resistor 502 and capacitor 308 are variable so that their RC time constant can be calibrated for PVT variations. In addition, by being variable, resistor 502 and capacitor 308 enable the gain of FLL 500 to be tunable as desired.

Furthermore, FIG. 5 shows an example implementation of filter 406, which includes a current mirror circuit (comprised of elements 506 and 510 in FIG. 5) and a low-pass filter 508. In an embodiment, low-pass filter 508 is characterized by two real poles. It is noted that the current mirror circuit allows filter 406 to be insensitive to non-linearities and PVT variations. In particular, because elements 506 and 510 have inverse transconductance gains, any non-linearities and PVT variations in filter 406 are eliminated.

Example implementations of various portions of FLL embodiments of the present invention are provided below. Embodiments of the present invention are not limited to the example implementations provided herein, but extend to any other implementations, variations, or improvements that would be apparent to a person skilled in the art based on the teachings herein.

Figure 6:
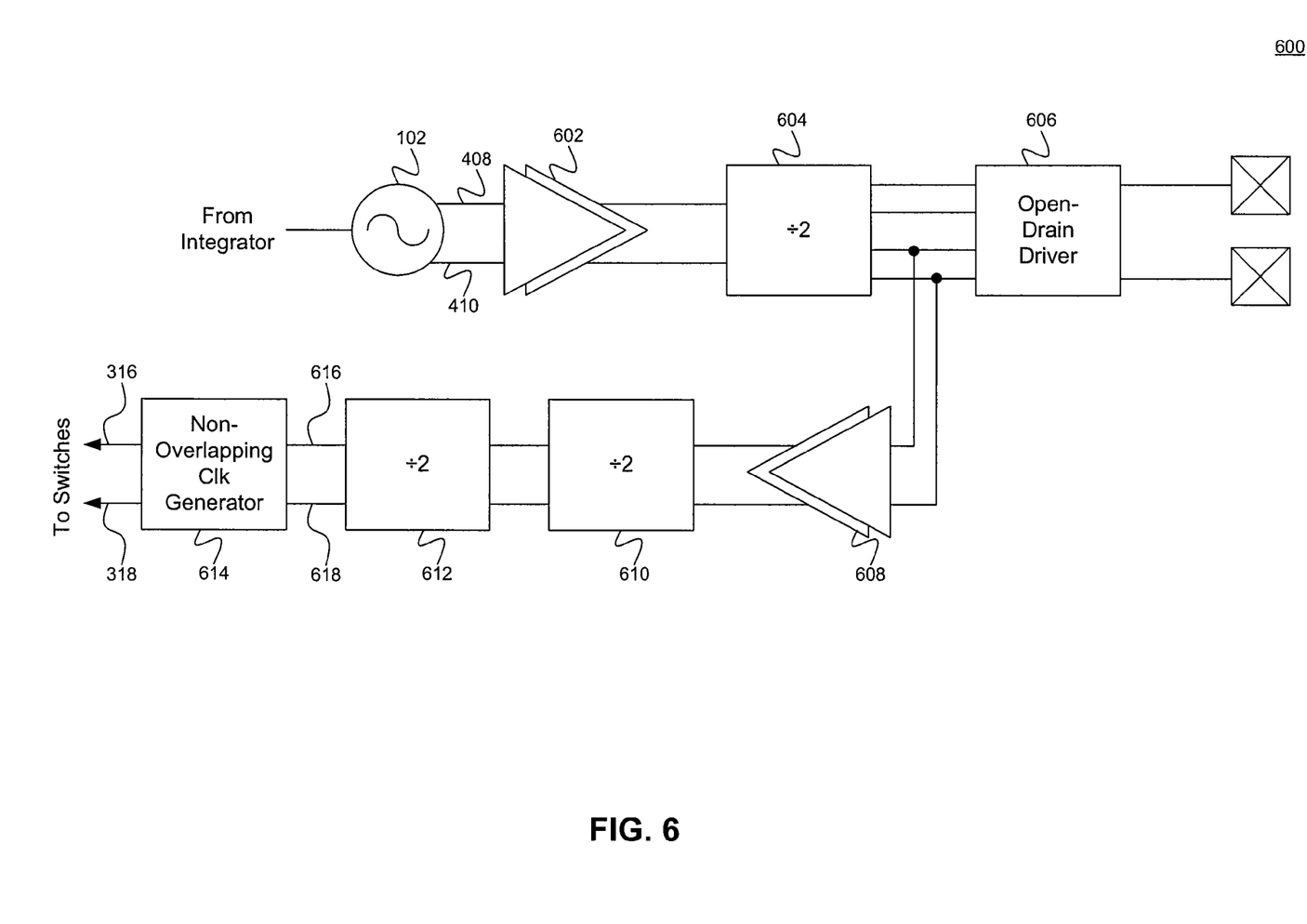
FIG. 6 illustrates an example implementation of a portion of a FLL according to an embodiment of the present invention.

FIG. 6 illustrates an example implementation 600 of a portion of a FLL according to an embodiment of the present invention. In particular, example implementation 600 shows a portion of the feed-forward section of the FLL and a portion of the feedback loop of the FLL. In the feed-forward section, example implementation 600 includes VCO 102, coupled to a buffer 602, and a divide-by-2 divider 604. An open-drain driver circuit 606 is coupled at the output of the FLL to provide a differential output of the FLL. In the feedback loop, example implementation 600 includes a buffer 608, followed by two divide-by-2 dividers 610 and 612 and a non-overlapping clock generator 614.

Dividers 604, 610 and 612 perform in the aggregate a division by 8 of the output of VCO 102 to generate inputs 616 and 618 of clock generator 614.

Clock generator 614 generates non-overlapping clock signals CLK 316 and $\overline{CLK}$ 318 based on inputs 616 and 618.

Figure 7:
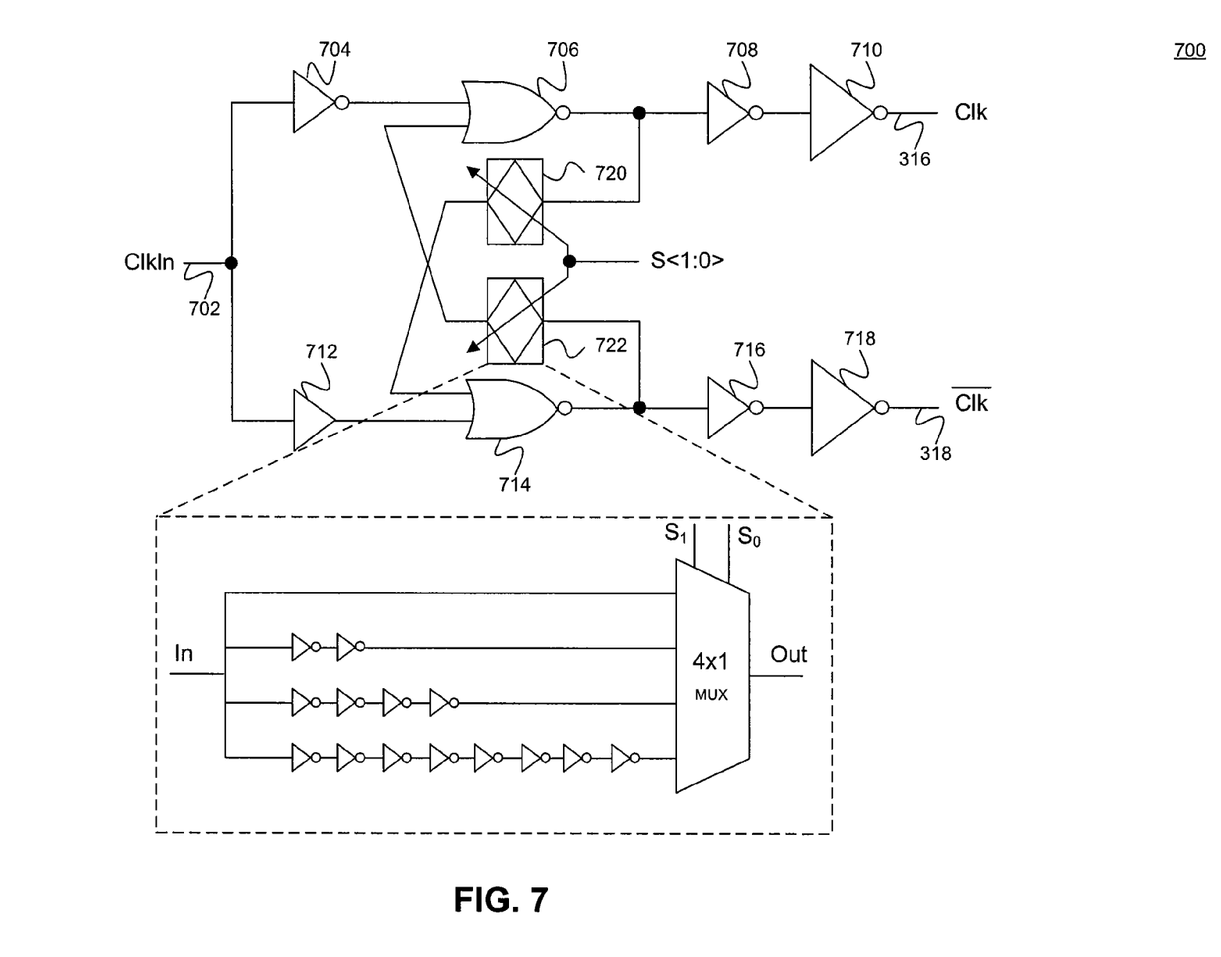
FIG. 7 illustrates an example implementation of a non-overlapping clock generator circuit according to an embodiment of the present invention.

FIG. 7 illustrates an example implementation 700 of a non-overlapping clock generator circuit according to an embodiment of the present invention. Example clock generator circuit 700 may be an implementation of non-overlapping clock generator 614, for example. As shown in FIG. 7, example clock generator circuit 700 receives an input clock signal ClkIn 702 and generates as output non-overlapping clock signals CLK 316 and $\overline{CLK}$ 318. In an embodiment, clock generator circuit 700 includes two parallel branches (will be referred to hereinafter as upper and lower branches), as shown in FIG. 7. The upper branch includes an inverter 704, followed by a NOR gate 706 and inverters 708 and 710. The lower branch includes a buffer 712, followed by a NOR gate 714 and inverters 716 and 718. NOR gates 706 and 714 are cross-coupled, as shown in FIG. 7, via multiplexers 720 and 722. In an embodiment, multiplexers 720 and 722 are 4:1 multiplexers.

Figure 8:
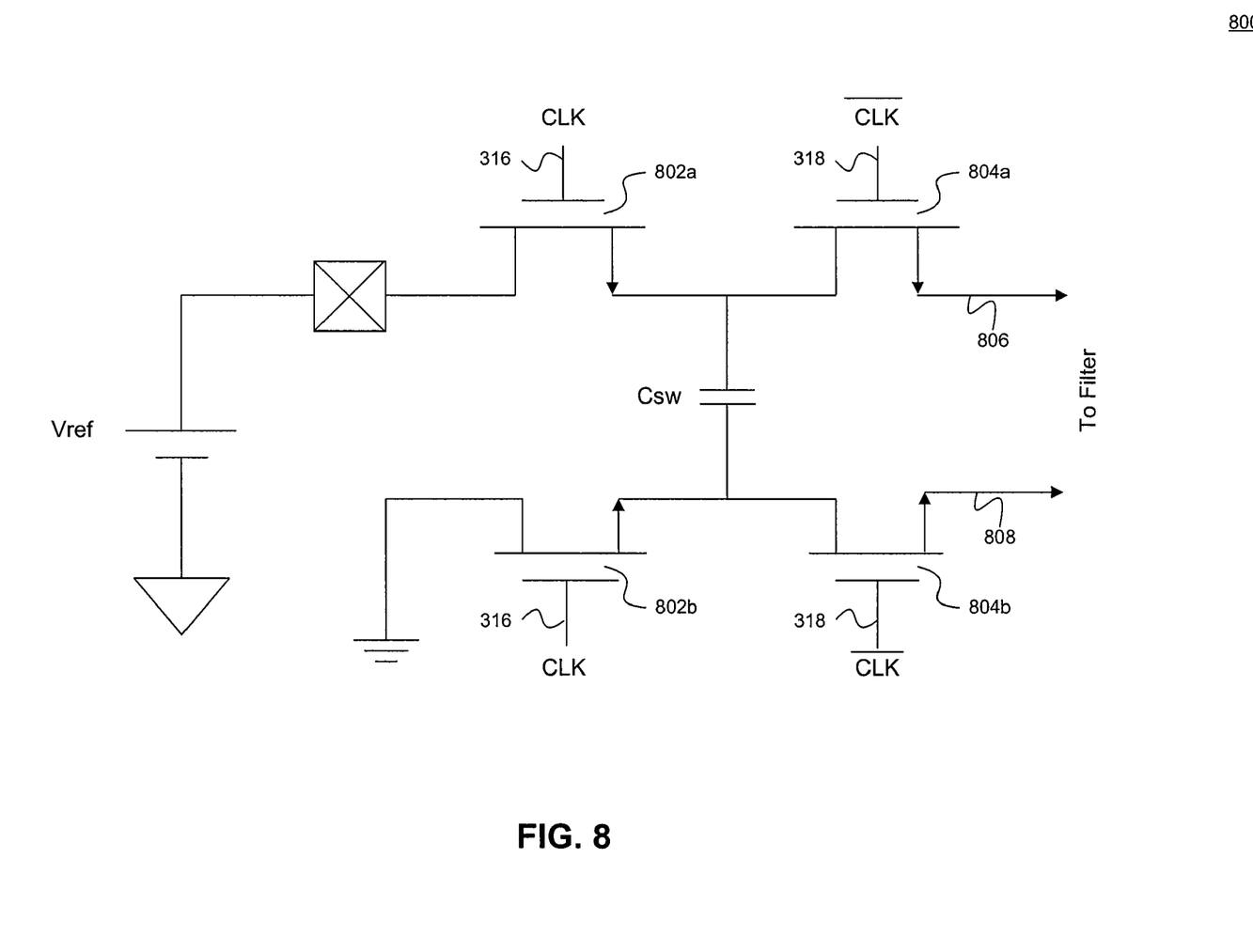
FIG. 8 illustrates an example implementation of a frequency to voltage (F/V) converter according to an embodiment of the present invention.

FIG. 8 illustrates an example implementation 800 of a frequency to voltage (F/V) converter according to an embodiment of the present invention. Example F/V converter 800 may be an implementation of F/V converter 104, for example. Example F/V converter 800 is similar to example F/V converter 300 described above with reference to FIG. 3. However, F/V converter 800 uses a differential switched capacitor circuit implementation, instead of the single-ended implementation of F/V converter 300. Thus, as shown in FIG. 8, F/V converter 800 includes two pairs of switches 802 and 804 (implemented in an embodiment using NMOS transistors), with switches 802a and 802b controlled by clock signal CLK 316 and switches 804a and 804b controlled by clock signal $\overline{CLK}$ 318. In addition, F/V converter 800 generates output signals 806 and 808. Operation of F/V converter 800 is similar to the operation of F/V converter 300, described above with reference to FIG. 3.

Figure 9:
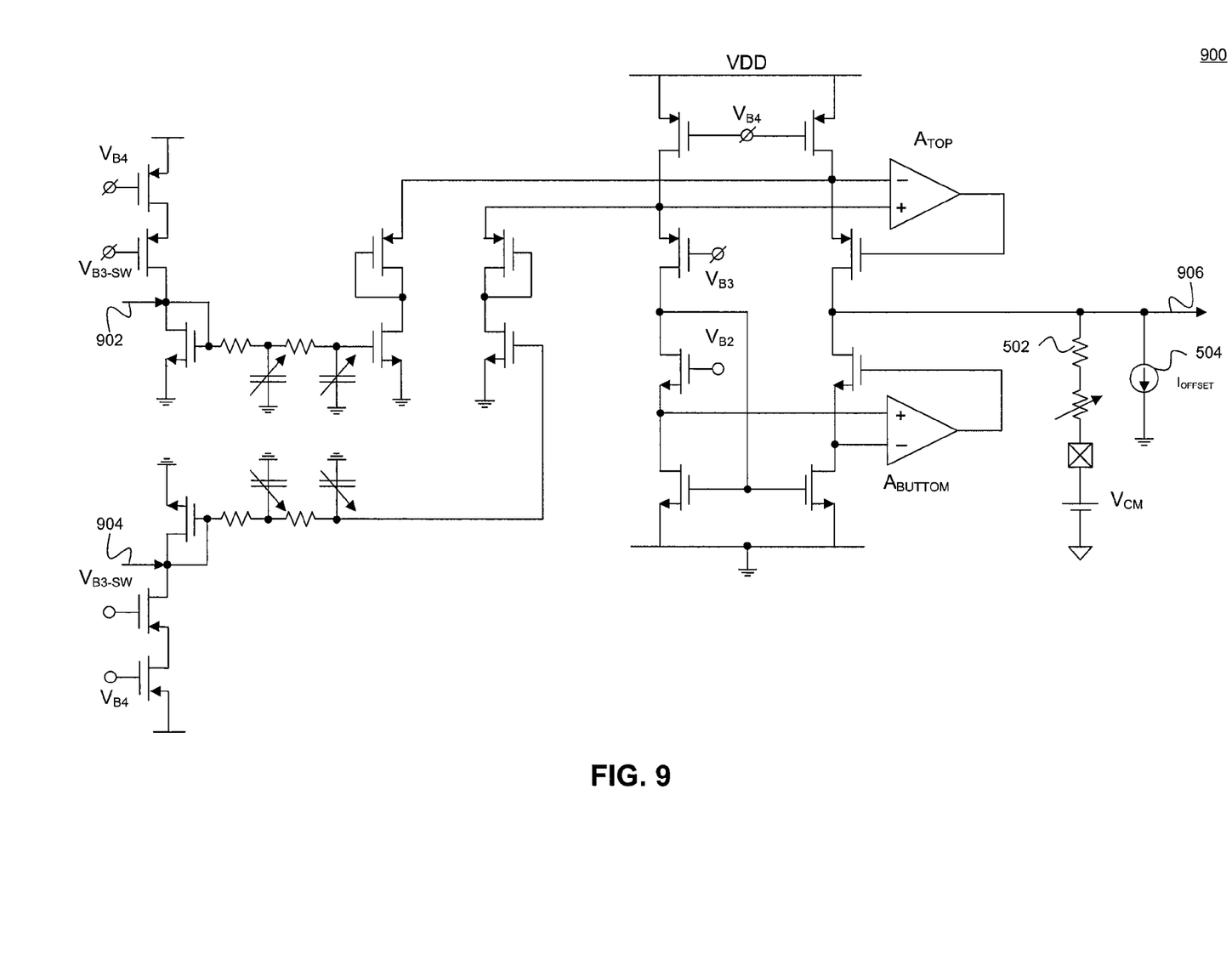
FIG. 9 illustrates an example implementation of a filter circuit according to an embodiment of the present invention.

FIG. 9 illustrates an example implementation 900 of a filter circuit according to an embodiment of the present invention. Example filter circuit 900 may be an implementation of filter 406, for example. As shown in FIG. 9, example filter 900 adopts a differential-to-single ended topology, receiving input signals 902 and 904 and generating output signal 906. In an embodiment, input signals 902 and 904 correspond respectively to output signals 806 and 808 of example F/V converter 800, described above. It is noted that by having a differential input, the need to stabilize the quiescent point of the input of example filter 900 against PVT variations is alleviated. Further, the size of the capacitors within example filter 900 can be reduced.

Figure 10:
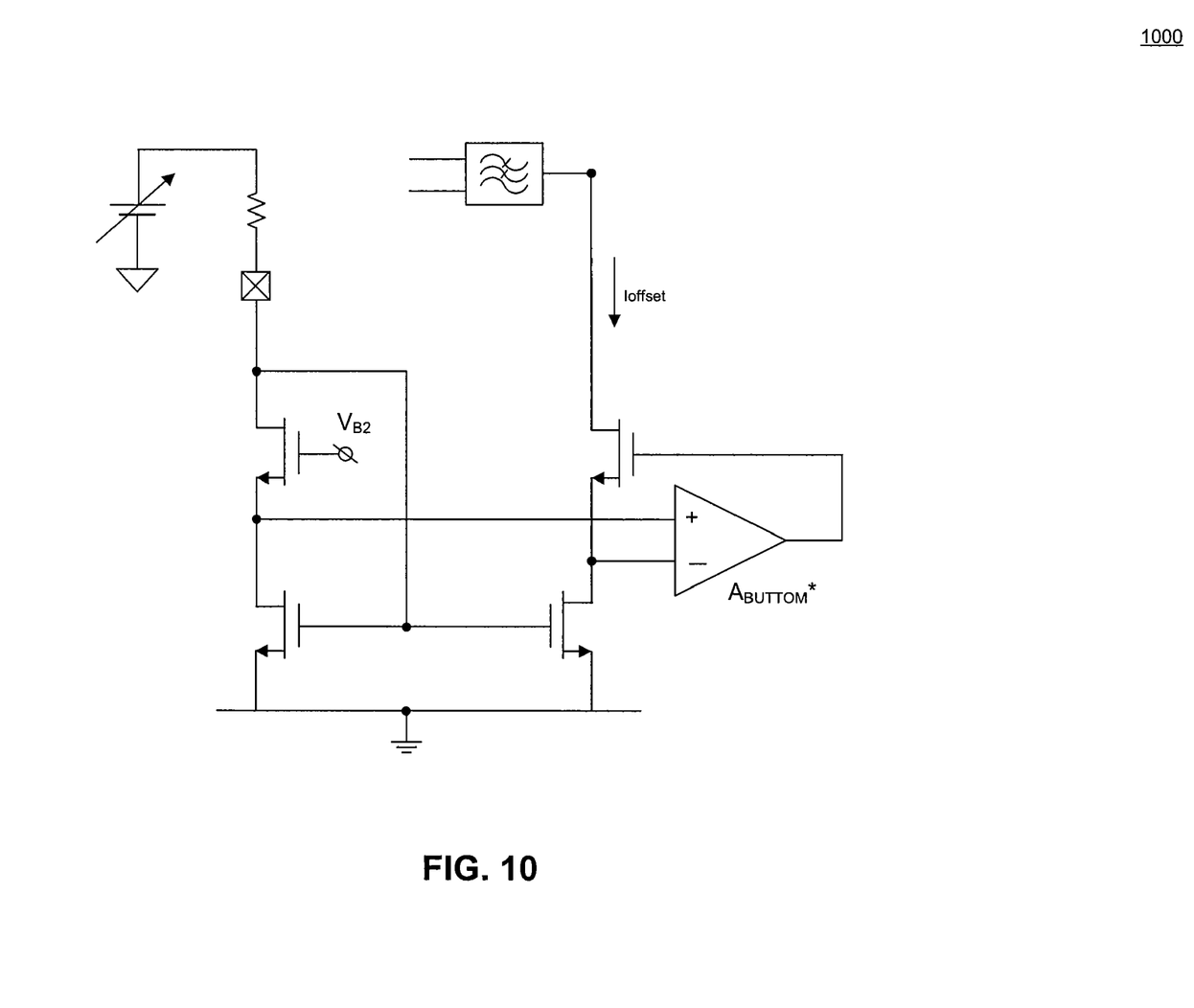
FIG. 10 illustrates an example implementation of an offset current source circuit according to an embodiment of the present invention.

FIG. 10 illustrates an example implementation 1000 of an offset current source circuit according to an embodiment of the present invention. Example current source circuit 1000 may be an implementation of offset current source 504, for example.

Figure 11:
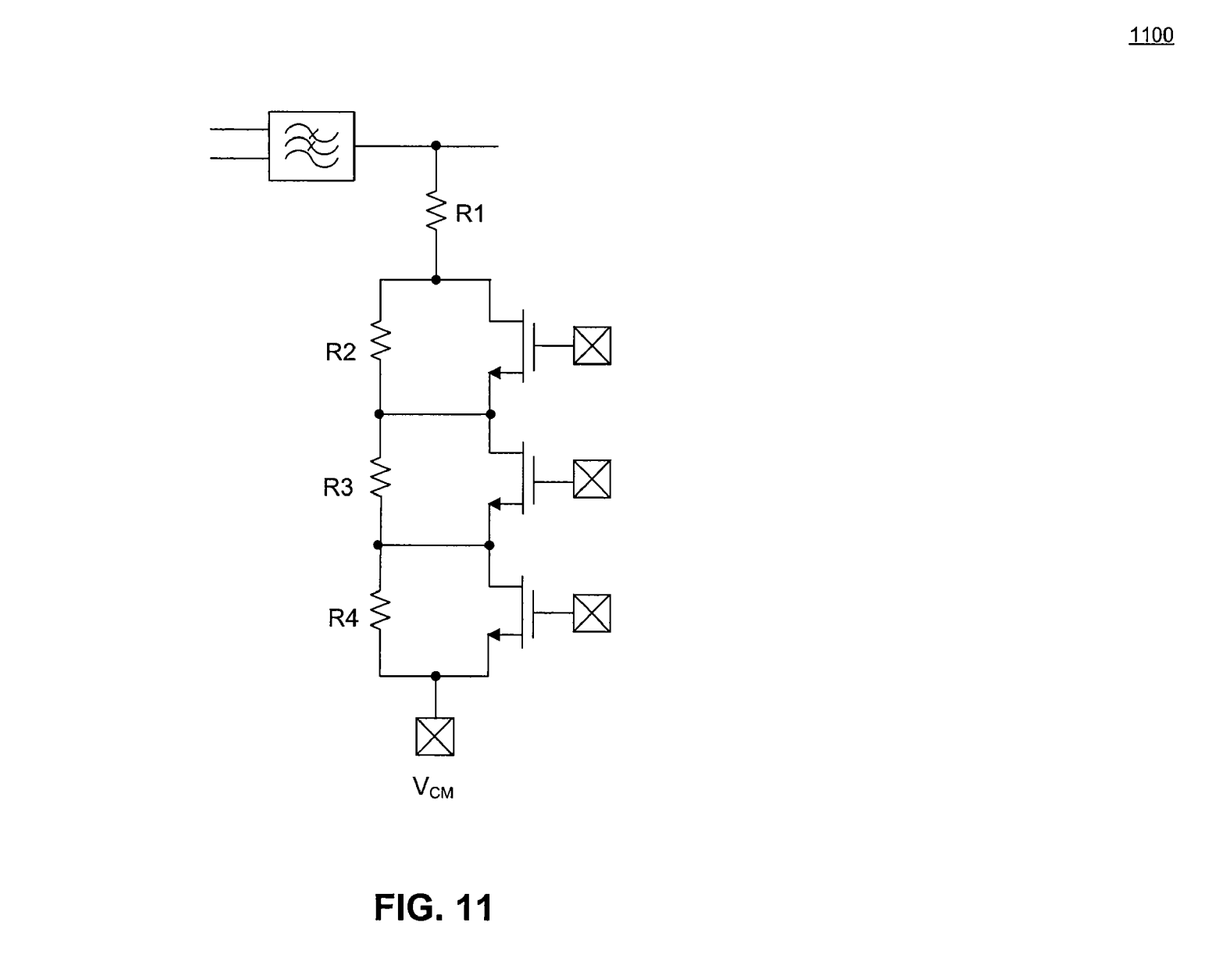
FIG. 11 illustrates an example implementation of a variable resistor according to an embodiment of the present invention.

FIG. 11 illustrates an example implementation 1100 of a variable resistor according to an embodiment of the present invention. Example variable resistor 1100 may be an implementation of variable load resistor 502, for example.

Figure 12:
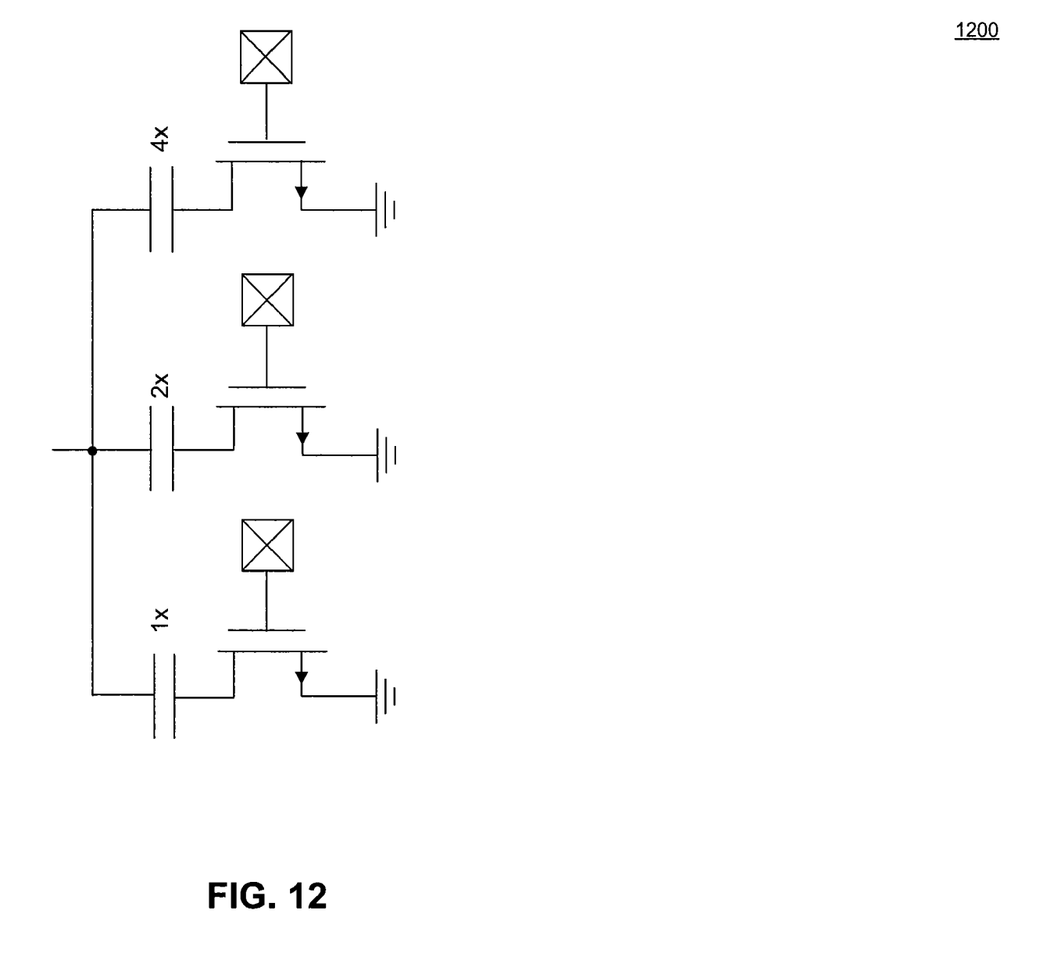
FIG. 12 illustrates an example implementation of a variable capacitor according to an embodiment of the present invention.

FIG. 12 illustrates an example implementation 1200 of a variable capacitor according to an embodiment of the present invention. Example variable capacitor 1200 may be an implementation of switching capacitor 308, for example.

Figure 13:
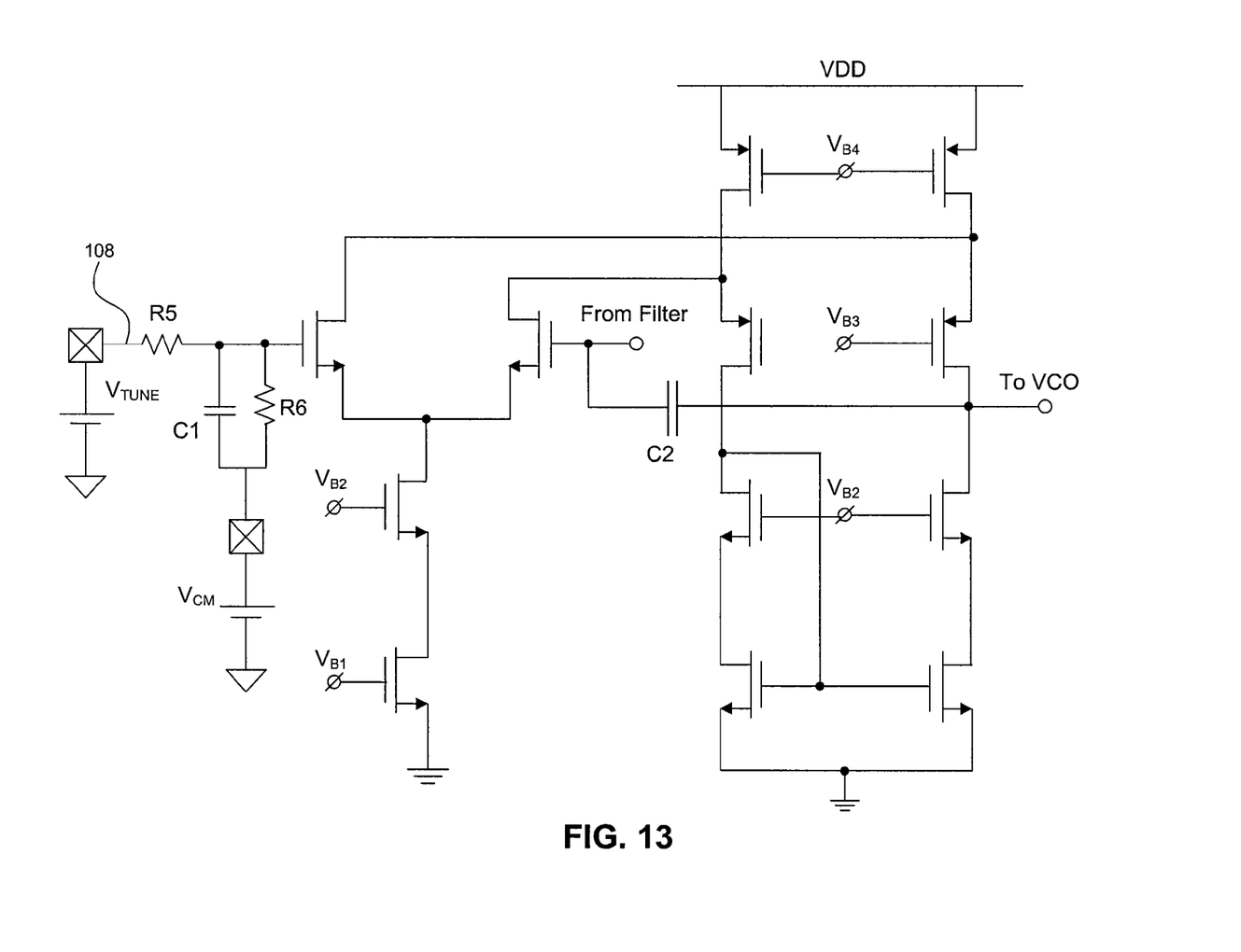
FIG. 13 illustrates an example implementation of an integrator circuit according to an embodiment of the present invention.

FIG. 13 illustrates an example implementation 1300 of an integrator circuit according to an embodiment of the present invention. Example integrator circuit 1300 may be an implementation of integrator 402, for example.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A frequency locked loop (FLL) having a feed-forward section and a feedback section, comprising:
    in the feed-forward section, a voltage controlled oscillator (VCO) that receives a control voltage signal and generates an output frequency signal;
    in the feedback section, a frequency-to-voltage (F/V) converter that receives the output frequency signal and generates a feedback voltage signal; and
    in the feed-forward section, a subtractor that receives an input tuning voltage and the feedback voltage signal and generates the control voltage signal;
    wherein the F/V converter comprises a switched capacitor circuit having a variable switching capacitor and a variable load resistor, and wherein a gain of the F/V converter is a function of a RC time constant of the switched capacitor circuit.

2. The FLL of claim 1, wherein the output frequency signal of the VCO is a linear function of the input tuning voltage.

3. The FLL of claim 1, wherein a gain of the FLL is linear and independent of process, voltage, and temperature (PVT) variations.

4. The FLL of claim 1, wherein a gain of the FLL is independent of frequency.

5. The FLL of claim 1, wherein a gain of the FLL only depends on a gain of the F/V converter.

6. The FLL of claim 1, wherein a gain of the FLL is independent of a gain of the VCO.

7. The FLL of claim 6, wherein the RC time constant of the switched capacitor circuit is maintained substantially constant.

8. The FLL of claim 1, further comprising calibration circuitry coupled to the switched capacitor circuit.

9. The FLL of claim 8, wherein the calibration circuitry calibrates the variable switching capacitor and the variable load resistor to maintain the RC time constant of the switched capacitor circuit at a fixed value independent of process, voltage, and temperature (PVT) variations.

10. The FLL of claim 8, wherein the calibration circuitry adjusts the variable switching capacitor and the variable load resistor to vary the gain of the F/V converter and a gain of the FLL.

11. The FLL of claim 1, wherein the switched capacitor circuit further comprises a plurality of switches that receive non-overlapping control clock signals and that alternately couple the variable switching capacitor to a reference voltage supply and the variable load resistor, thereby transferring charge from the reference voltage supply to the variable load resistor at a switching frequency of the clock signals.

12. The FLL of claim 11, wherein an output voltage of the switched capacitor circuit across the variable load resistor is a function of the switching frequency of the non-overlapping control clock signals.

13. The FLL of claim 1, wherein the subtractor comprises an operational amplifier-based integrator circuit.

14. The FLL of claim 1, further comprising in the feedback section:
    one or more frequency dividers coupled between the VCO and the F/V converter; and
    a filter, coupled to an output of the F/V converter, that filters the feedback voltage signal.

15. The FLL of claim 14, wherein the filter includes a current-mode second-order low-pass filter.

16. The FLL of claim 14, wherein the filter includes a current mirror circuit that enables the filter to be insensitive to non-linearities and process, temperature, and voltage (PVT) variations.

17. The FLL of claim 14, further comprising in the feedback section:
    an offset current source, coupled to an output of the filter, that absorbs an output current signal of the filter when the input tuning voltage is equal to zero.

18. The FLL of claim 1, further comprising in the feedback section:
    a non-overlapping clock generator circuit, coupled between the VCO and the F/V converter, that receives the output frequency signal and that generates non-overlapping control clock signals.

19. The FLL of claim 18, wherein the F/V converter receives the non-overlapping control clock signals and generates the feedback voltage signal as representative of a frequency of the non-overlapping control clock signals.

20. The FLL of claim 1, wherein the VCO is a differential output oscillator, wherein the frequency output signal comprises differential frequency output signals.

21. The FLL of claim 1, wherein the FLL is nested within a phase locked loop (PLL).

* * * * *